United States Patent
Yamamoto et al.

(10) Patent No.: US 11,090,751 B2
(45) Date of Patent: Aug. 17, 2021

(54) REFLOW DEVICE AND METHOD FOR MANUFACTURING SUBSTRATE USING THE REFLOW DEVICE

(71) Applicant: DENSO CORPORATION, Kariya (JP)

(72) Inventors: Masayasu Yamamoto, Kariya (JP); Atsushi Furumoto, Kariya (JP); Masato Kamino, Kariya (JP); Hisahiro Ikeda, Kariya (JP); Hiroki Kamiya, Kariya (JP)

(73) Assignee: DENSO CORPORATION, Kariya (JP)

( * ) Notice: Subject to any disclaimer, the term of this patent is extended or adjusted under 35 U.S.C. 154(b) by 229 days.

(21) Appl. No.: 16/407,806

(22) Filed: May 9, 2019

(65) Prior Publication Data

US 2019/0262924 A1    Aug. 29, 2019

Related U.S. Application Data

(63) Continuation of application No. PCT/JP2017/037612, filed on Oct. 18, 2017.

(30) Foreign Application Priority Data

Nov. 18, 2016    (JP) .............................. JP2016-225140

(51) Int. Cl.
*B23K 1/00* (2006.01)
*B23K 3/00* (2006.01)
*B23K 3/04* (2006.01)
*B23K 1/008* (2006.01)
*B23K 1/012* (2006.01)
(Continued)

(52) U.S. Cl.
CPC .................. *B23K 3/04* (2013.01); *B23K 1/00* (2013.01); *B23K 1/008* (2013.01); *B23K 1/012* (2013.01); *H05K 3/34* (2013.01); *H05K 3/3494* (2013.01); *B23K 2101/42* (2018.08); *H05K 2203/081* (2013.01)

(58) Field of Classification Search
CPC .. B23K 1/008; B23K 1/0016; B23K 2101/40; B23K 3/047; B23K 1/012; B23K 1/20; B23K 3/04; H05K 3/3494; H05K 13/0465; H05K 2203/163; H05K 3/34
See application file for complete search history.

(56) References Cited

U.S. PATENT DOCUMENTS

| | | | |
|---|---|---|---|
| 6,135,344 A | 10/2000 | Sakuyama et al. | |
| 6,345,757 B1 | 2/2002 | Sakuyama et al. | |
| 2013/0119112 A1 | 5/2013 | Sukekawa et al. | |

FOREIGN PATENT DOCUMENTS

| | | |
|---|---|---|
| CN | 103648700 A | 3/2014 |
| JP | H01262069 A | 10/1989 |

(Continued)

*Primary Examiner* — Erin B Saad
(74) *Attorney, Agent, or Firm* — Harness, Dickey & Pierce, P.L.C.

(57) ABSTRACT

A reflow device configured to perform reflow soldering on a substrate having a first component and a second component having a heat capacity larger than a heat capacity of the first component. The reflow device includes a plurality of heating sections applying gas to the substrate, a booth accommodating the heating sections, and a controller configured to perform, at least twice or more times, a heating control of controlling the heating sections to increase both of a temperature of the first component and a temperature of the second component, and then reduce the temperature of the first component while increasing the temperature of the second component.

10 Claims, 11 Drawing Sheets

(51) Int. Cl.
*H05K 3/34* (2006.01)
*B23K 101/42* (2006.01)

(56) References Cited

FOREIGN PATENT DOCUMENTS

| | | |
|---|---|---|
| JP | H10145037 A | 5/1998 |
| JP | H11054603 A | 2/1999 |
| JP | 2000022325 A | 1/2000 |
| JP | 2001-127422 A | 5/2001 |
| JP | 2002016352 A | 1/2002 |
| JP | 2002324972 A | 11/2002 |
| JP | 2009200072 A | 9/2009 |
| JP | 2013105933 A | 5/2013 |

REFLOW DEVICE AND METHOD FOR MANUFACTURING SUBSTRATE USING THE REFLOW DEVICE

CROSS REFERENCE TO RELATED APPLICATIONS

The present application is a continuation application of International Patent Application No. PCT/JP2017/037612 filed on Oct. 18, 2017, which designated the United States and claims the benefit of priority from Japanese Patent Application No. 2016-225140 filed on Nov. 18, 2016. The entire disclosures of all of the above applications are incorporated herein by reference.

TECHNICAL FIELD

The present disclosure relates to a reflow device and a method for manufacturing a substrate using the same.

BACKGROUND

In a reflow soldering technique, a solder which has been applied in advance at a room temperature, is melted to join components. For example, a reflow device performs reflow-soldering on a printed substrate.

SUMMARY

The present disclosure describes a reflow device used for reflow-soldering a first component and a second component, having different heat capacity, on a substrate, and a method for manufacturing the substrate using the reflow device.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
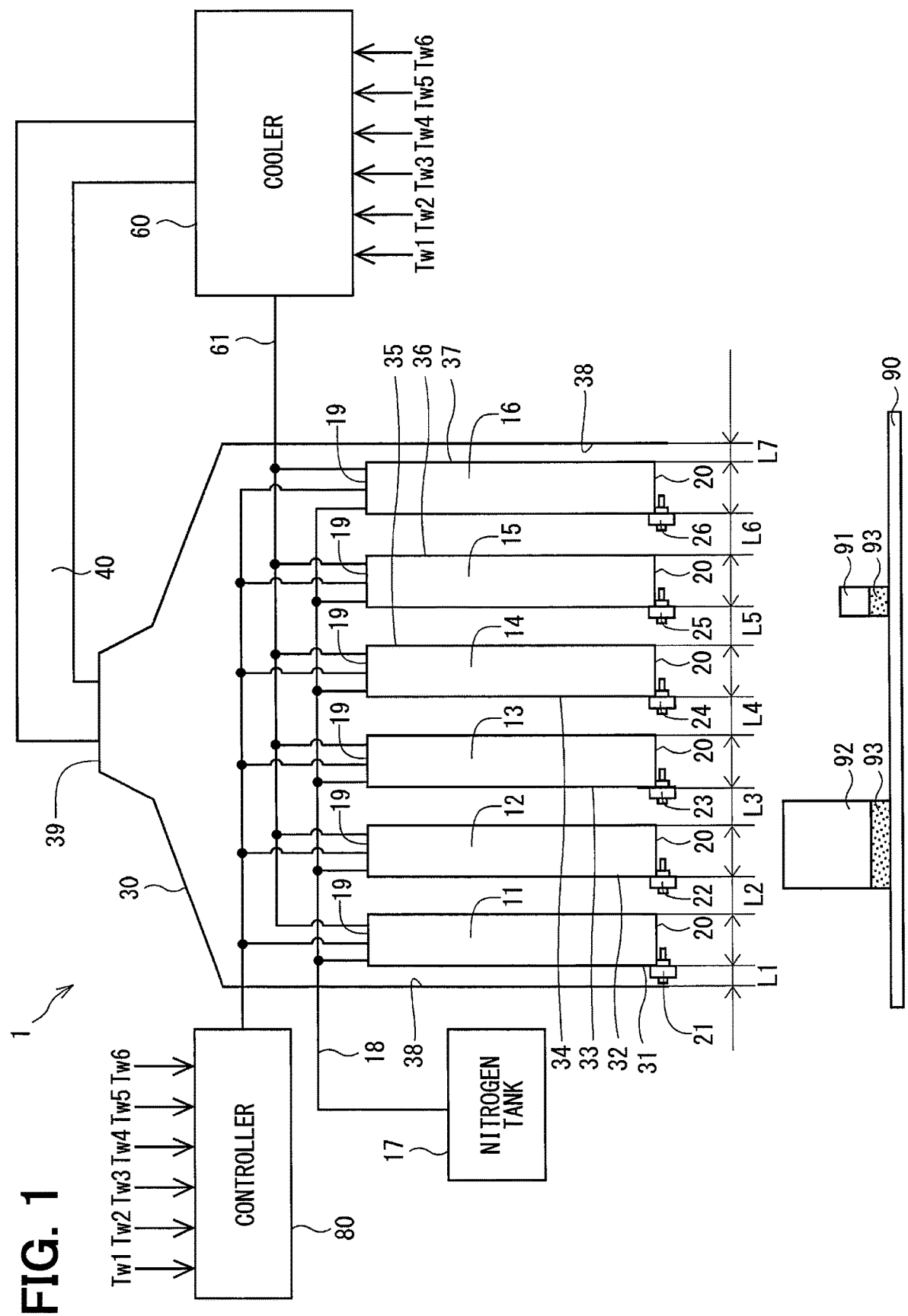
FIG. 1 is a diagram illustrating a configuration of a reflow device according to a first embodiment of the present disclosure.

For example, on a substrate used for an in-vehicle electronic control unit, not only a surface mounted component having a relatively small heat capacity such as an integrated circuit or a resistor, but also a surface mounted component having a relatively large heat capacity such as an aluminum electrolytic capacitor, a reactor, or a resin connector is mounted. A heat capacity difference of the components over the substrate may be increased in the future.

As a method for mounting such surface mounted components on a substrate, reflow soldering is used. If the heat capacity difference over the substrate increases, a surface mounted component having a smaller heat capacity is likely to be in an excessively heated state, while a surface mounted component having a larger heat capacity is likely to be in an unmelted state. Even if the heat capacity difference over the substrate increases, it is desirable to uniformly heat the solder applied to the substrate. In addition, the time required to heat the solder is likely to be elongated due to the surface mounted component having the larger heat capacity. However, it is desirable to shorten the time for heating the solder applied to the substrate is heated.

As an example of the reflow soldering technique, a hot gas flow at a relatively high temperature may be applied to a component having a larger heat capacity and a warm gas flow at a relatively low temperature may be supplied to a component having a smaller heat capacity. In such a technique, however, the positions of the surface mounted components over the substrate are limited, and a reflow device may be complicated or increased in size.

According to a first aspect of the present disclosure, a reflow device is configured to perform reflow soldering on a substrate having a first component and a second component having a heat capacity larger than a heat capacity of the first component. The reflow device includes a plurality of hating sections, a booth, and a controller.

Each of the heating sections is configured to apply gas to a substrate so as to increase a temperature of the first component and a temperature of the second component. The booth accommodates the plurality of heating sections therein. The booth has an exhaust flow path and an exhaust opening. The exhaust flow path is defined between an inner wall of the booth and the heating sections and between adjacent heating sections. The exhaust flow path communicates with the exhaust opening. The exhaust flow path and the exhaust opening allow the gas applied from each of the heating sections to exhaust. The controller performs, at least twice or more times, a heating control of controlling the heating sections to increase both of the temperature of the first component and the temperature of the second component, and then reduce the temperature of the first component while increasing the temperature of the second component.

In such a configuration, the temperature of the first component can be maintained at a constant level of equal to or more than a melting point of a solder, while allowing the temperature of the second component to increase to the melting point of the solder. As a result, a difference between the temperature of the first component and the temperature of the second component is likely to decrease so that a temperature over the substrate is equalized. In addition, since it is sufficient to only set the control of the reflow device, the reflow device has a simpler configuration.

According to a second aspect of the present disclosure, a method for manufacturing a substrate using the foregoing reflow device includes performing a first temperature control, performing a second temperature control, and repetitively performing the first temperature control and the second temperature control.

The first temperature control is performed to increase the temperature of the first component and the temperature of the second component. The second temperature control is performed to reduce the temperature of the first component and increases the temperature of the second component, after the first temperature control is performed. The first temperature control and the second temperature control are repeated in this order, at least twice or more times.

The following will describe a reflow device 1 according to an embodiment of the present disclosure on the basis of the drawings. In the description of a plurality of embodiments, a configuration which is substantially the same as in the first embodiment is described by being given the same reference numeral. Also, when the present embodiment is referred to, the present embodiment includes the plurality of embodiments.

First Embodiment

As shown in FIG. 1, the reflow device 1 is used to perform the reflow soldering of a first component 91 and a second component 92 each as a surface mounted component onto a substrate 90. For example, the substrate 90 is used for an in-vehicle electronic control unit. Between the substrate 90 and the first component 91 and between the substrate 90 and the second component 92, a solder paste 93 is printed or applied.

The first component 91 is a component having a smallest heat capacity on the substrate 90. For example, the first component 91 is an integrated circuit, a resistor, or the like. The second component 92 is a component having a largest heat capacity on the substrate 90. For example, the second component 92 is an aluminum electrolytic capacitor, a reactor, a resin connector, or the like.

The heat capacity of the first component 91 is assumed to be a first heat capacity $H1$, while the heat capacity of the second component 92 is assumed to be a second heat capacity $H2$. The difference between the second heat capacity $H2$ and the first heat capacity $H1$ is assumed to be a heat capacity difference $\Delta H$. The second heat capacity $H2$ is larger than the first heat capacity $H1$, that is, $H2>H1$ is satisfied. The temperature of the first component 91 is assumed to be a lower-heat-capacity temperature $T1$, while the temperature of the second component 92 is assumed to a higher-heat-capacity temperature $T2$. Since the second heat capacity $H2$ is larger than the first heat capacity $H1$, the higher-heat-capacity temperature $T2$ is less likely to increase than the lower-heat-capacity temperature $T1$.

The reflow device 1 includes first to sixth heating sections 11 to 16 as a plurality of heating sections, a booth 30, a cooler 60, and a controller 80. The substrate 90 is stationary and fixed with respect to the reflow device 1. The reflow device 1 is a so-called batch furnace. The first to sixth heating sections 11 to 16 are accommodated in the booth 30 and provided to be equidistantly spaced apart from each other. The first heating section 11 and the sixth heating section 16 are opposed to an inner wall 38 of the booth 30.

The first heating section 11 is provided between the inner wall 38 of the booth 30 and the second heating section 12. The second heating section 12 is provided between the first heating section 11 and the third heating section 13. The third heating section 13 is provided between the second heating section 12 and the fourth heating section 14. The fourth heating section 14 is provided between the third heating section 13 and the fifth heating section 15. The fifth heating section 15 is provided between the fourth heating section 14 and the sixth heating section 16. The sixth heating section 16 is provided between the inner wall 38 of the booth 30 and the fifth heating section 15.

The distance from the inner wall 38 of the booth 30 to the first heating section 11 is assumed to be a first distance $L1$. The distance from the first heating section 11 to the second heating section 12 is assumed to be a second distance $L2$. The distance from the second heating section 12 to the third heating section 13 is assumed to be a third distance $L3$. The distance from the third heating section 13 to the fourth heating section 14 is assumed to be a fourth distance $L4$. The distance from the fourth heating section 14 to the fifth heating section 15 is assumed to be a fifth distance $L5$. The distance from the fifth heating section 15 to the sixth heating section 16 is assumed to be a sixth distance $L6$. The distance from the sixth heating section 16 to the inner wall 38 of the booth 30 is assumed to be a seventh distance $L7$. Each of the second to sixth distances $L2$ to $L6$ corresponds to the distance between any adjacent two of the first to sixth heating sections 11 to 16.

The first to sixth heating sections 11 to 16 and the booth 30 are provided such that the first to seventh distances $L1$ to $L7$ are equal, that is, the following relational expression (1) is satisfied. Each of the first distance $L1$ and the seventh distance $L7$ is set to be half of each of the second to sixth distances $L2$ to $L6$. It is assumed herein that each of "=" and "half" includes an error range applicable in common sense. In the description, it is assumed that interpretations of "=", "equal", and "half" include broad interpretations:

$$L2=L3=L4=L5=L6 \qquad (1).$$

Each of the first to sixth heating sections 11 to 16 is formed into a tubular shape. Each of the first to sixth heating sections 11 to 16 has an exhaust-side opening 19 and a blow-side opening 20. In each of the first to sixth heating sections 11 to 16, the exhaust-side opening 19 is provided at an exhaust side opposite to the substrate 90, and the blow-side opening 20 is provided on a side closer to the substrate 90.

Each of the first to sixth heating sections 11 to 16 can apply a gas to the substrate 90 and has a blower such as a compressor. Note that the blowers of the first to sixth heating sections 11 to 16 may also be provided separately from the first to sixth heating sections 11 to 16. For example, the gas used for the first to sixth heating sections 11 to 16 is nitrogen. The use of nitrogen as the gas inhibits oxidation of the solder paste 93 and inhibits a defect such as a void in a joint part formed by the solder.

The first to sixth heating sections 11 to 16 have a nitrogen tank 17 and a nitrogen pipe 18. The nitrogen tank 17 is a container in which nitrogen is sealed. The nitrogen pipe 18 is connected to the nitrogen tank 17 and to the exhaust-side openings 19. From the nitrogen tank 17, nitrogen is supplied to the first to sixth heating sections 11 to 16 through the nitrogen pipe 18 and, from the first to sixth heating sections 11 to 16, nitrogen is blown toward the substrate 90.

Figure 2:
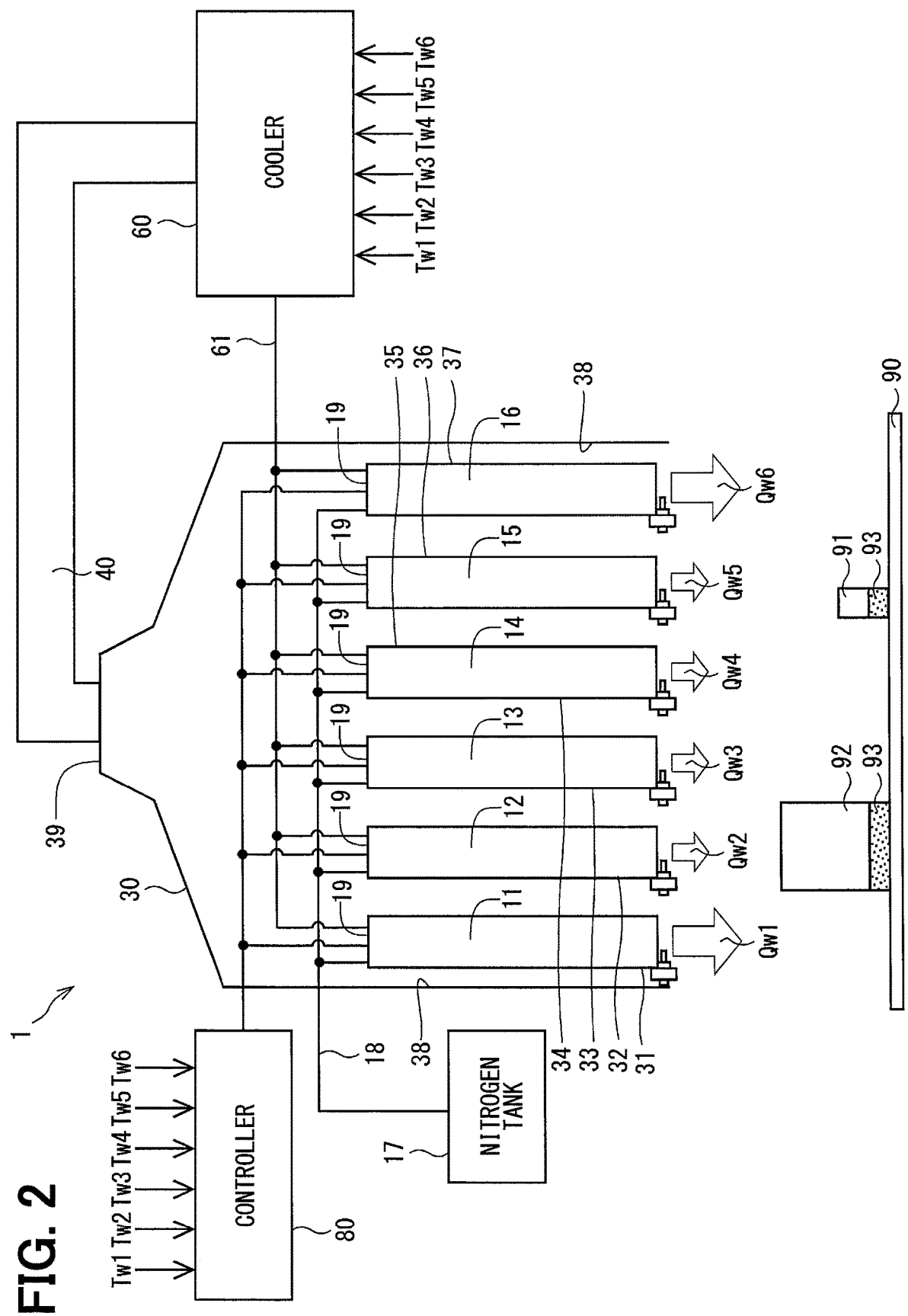
FIG. 2 is a diagram illustrating the configuration of the reflow device according to the first embodiment of the present disclosure.

The gas volume of nitrogen blown from the first heating section 11 is assumed to be a first gas volume $Qw1$. The gas volume of nitrogen blown from the second heating section 12 is assumed to be a second gas volume $Qw2$. The gas volume of nitrogen blown from the third heating section 13 is assumed to be a third gas volume Qw3. The gas volume of nitrogen blown from the fourth heating section 14 is assumed to be a fourth gas volume Qw4. The gas volume of nitrogen blown from the fifth heating section 15 is assumed to be a fifth gas volume Qw5. The gas volume of nitrogen blown from the sixth heating section 16 is assumed to be a sixth gas volume Qw6. As shown in FIG. 2, the first to sixth heating sections 11 to 16 are configured such that each of the first gas volume Qw1 and the sixth gas volume Qw6 is larger than each of the second to fifth gas volumes Qw2 to Qw5.

Each of the first to sixth heating sections 11 to 16 has a heater wound around the outer wall thereof to allow the supplied nitrogen to be heated. Each of the first to sixth heating sections 11 to 16 heats the supplied nitrogen and blows the heated nitrogen to the substrate 90 to allow a substrate temperature Tb to be increased. Each of the first to sixth heating sections 11 to 16 increases the substrate temperature Tb to allow each of the lower-heat-capacity temperature T1 and the higher-heat-capacity temperature T2 to be increased. Between the blow-side openings 20 and the substrate 90, a plurality of first to sixth temperature sensors 21 to 26 are provided.

The temperature of the nitrogen blown from the first heating section 11 is assumed to be a first hot gas temperature Tw1. The temperature of the nitrogen blown from the second heating section 12 is assumed to be a second hot gas temperature Tw2. The temperature of the nitrogen blown from the third heating section 13 is assumed to be a third hot gas temperature Tw3. The temperature of the nitrogen blown from the fourth heating section 14 is assumed to be a fourth hot gas temperature Tw4. The temperature of the nitrogen blown from the fifth heating section 15 is assumed to be a fifth hot gas temperature Tw5. The temperature of the nitrogen blown from the sixth heating section 16 is assumed to be a sixth hot gas temperature Tw6.

The first temperature sensor 21 is capable of measuring the first hot gas temperature Tw1. The second temperature sensor 22 is capable of measuring the second hot gas temperature Tw2. The third temperature sensor 23 is capable of measuring the third hot gas temperature Tw3. The fourth temperature sensor 24 is capable of measuring the fourth hot gas temperature Tw4. The fifth temperature sensor 25 is capable of measuring the fifth hot gas temperature Tw5. The sixth temperature sensor 26 is capable of measuring the sixth hot gas temperature Tw6. The first to sixth temperature sensors 21 to 26 are, for example, K-thermocouples as JIS-compliant thermocouples. The first to sixth temperature sensors 21 to 26 output the measured first to sixth hot gas temperatures Tw1 to Tw6 to the cooler 60 and to the controller 80.

The booth 30 is formed in a tubular shape, accommodates the first to sixth heating sections 11 to 16, and has a plurality of first to seventh exhaust flow paths 31 to 37, an exhaust opening 39, and a booth pipe 40. The booth 30 has a tapered shape in which the diameter of the booth 30 decreases with approach to the exhaust opening 39.

Each of the first to seventh exhaust flow paths 31 to 37 is provided to be sectioned between any adjacent two of the first to sixth heating sections 11 to 16, between the first heating section 11 and the inner wall 38 of the booth 30, or between the sixth heating section 16 and the inner wall 38 of the booth 30.

The first exhaust flow path 31 is formed by the inner wall 38 of the booth 30 and the first heating section 11. The second exhaust flow path 32 is formed by the first heating section 11 and the second heating section 12. The third exhaust flow path 33 is formed by the second heating section 12 and the third heating section 13. The fourth exhaust flow path 34 is formed by the third heating section 13 and the fourth heating section 14. The fifth exhaust flow path 35 is formed by the fourth heating section 14 and the fifth heating section 15. The sixth exhaust flow path 36 is formed by the fifth heating section 15 and the sixth heating section 16. The seventh exhaust flow path 37 is formed by the sixth heating section 16 and the inner wall 38 of the booth 30.

The exhaust opening 39 is provided in the booth 30 opposite to the substrate 90 to communicate with the first to seventh exhaust flow paths 31 to 37. The nitrogen blown from the first to sixth heating sections 11 to 16 to the substrate 90 is exhausted from the exhaust opening 39 through the first to seventh exhaust flow paths 31 to 37. The booth pipe 40 is connected to the exhaust opening 39 and to the cooler 60. The nitrogen exhausted from the exhaust opening 39 is supplied to the cooler 60 through the booth pipe 40.

The cooler 60 retrieves and cools the nitrogen exhausted from the exhaust opening 39 through the first to seventh exhaust flow paths 31 to 37. The cooler 60 has a cooling pipe 61. The cooling pipe 61 is connected to the cooler 60 and to the first to sixth heating sections 11 to 16. The cooled nitrogen is supplied to the first to sixth heating sections 11 to 16 through the cooling pipe 61.

Of the first to sixth hot gas temperatures Tw1 to Tw6, the lowest one is assumed to be a minimum temperature Tmin. The cooler 60 supplies the cooled nitrogen to the first to sixth heating sections 11 to 16 such that the first to sixth hot gas temperatures Tw1 to Tw6 are equal to or less than the minimum temperature Tmin.

As shown below by Relational Expression (2), it is assumed that an average value of the first to sixth hot gas temperatures Tw1 to Tw6 is an average hot gas temperature Tave. For example, the cooler 60 compares the first to sixth hot gas temperatures Tw1 to Tw6 to the average hot gas temperature Tave. It is assumed that the first hot gas temperature Tw1, the second hot gas temperature Tw2, and the fourth hot gas temperature Tw4 are higher than the average hot gas temperature Tave. It is assumed that the third hot gas temperature Tw3, the fifth hot gas temperature Tw5, and the sixth hot gas temperature Tw6 are lower than the average hot gas temperature Tave.

$$Tave=(Tw1+Tw2+Tw3+Tw4+Tw5+Tw6)/6 \quad (2).$$

The cooler 60 supplies the cooled nitrogen to the first heating section 11, the second heating section 12, and the fourth heating section 14 such that the first to sixth hot gas temperatures Tw1 to Tw6 are equal to or less than the minimum temperature Tmin.

Thus, the cooler 60 supplies the cooled nitrogen to the first to sixth heating sections 11 to 16 each of which blows the hot gas having the temperature higher than the average hot gas temperature Tave to control each of the first to sixth hot gas temperatures Tw1 to Tw6 to a level of equal to or less than the minimum temperature Tmin. Note that, to allow the cooled nitrogen to be supplied to each of the first to sixth heating sections 11 to 16, respective electromagnetic valves are provided in the first to sixth heating sections 11 to 16.

The controller 80 feedbacks the first to sixth hot gas temperatures Tw1 to Tw6 to allow the respective heaters of the first to sixth heating sections 11 to 16 to be controlled. The controller 80 controls the respective heaters of the first to sixth heating sections 11 to 16 to control the lower-heat-capacity temperature T1 and the higher-heat-capacity temperature T2.

The controller 80 controls the first to sixth heating sections 11 to 16 to increase both of the lower-heat-capacity temperature T1 and the higher-heat-capacity temperature T2, and then reduce the lower-heat-capacity temperature T1 while increase the higher-heat-capacity temperature T2. The controller 80 performs, at least twice or more times, a process in which each of the lower-heat-capacity temperature T1 and the higher-heat-capacity temperature T2 is increased, and then the lower-heat-capacity temperature T1 is reduced, while the higher-heat-capacity temperature T2 is increased. The controller 80 also controls the first to sixth heating sections 11 to 16 such that, when the lower-heat-capacity temperature T1 is reduced, the first to sixth hot gas temperatures Tw1 to Tw6 are equal to or more than a melting point Tp of a solder.

A description will be given of the control by the controller 80 with reference to the time chart of FIG. 3.

It is assumed that x0 denotes the time at which the controller 80 starts to control the first to sixth heating sections 11 to 16. In FIG. 3, the lower-heat-capacity temperature T1 and the higher-heat-capacity temperature T2 are shown by the solid lines. The first to sixth hot gas temperatures Tw1 to Tw6 are shown by the dot-dash lines. The melting point Tp of the solder is shown by the two-dot-dash line.

Figure 3:
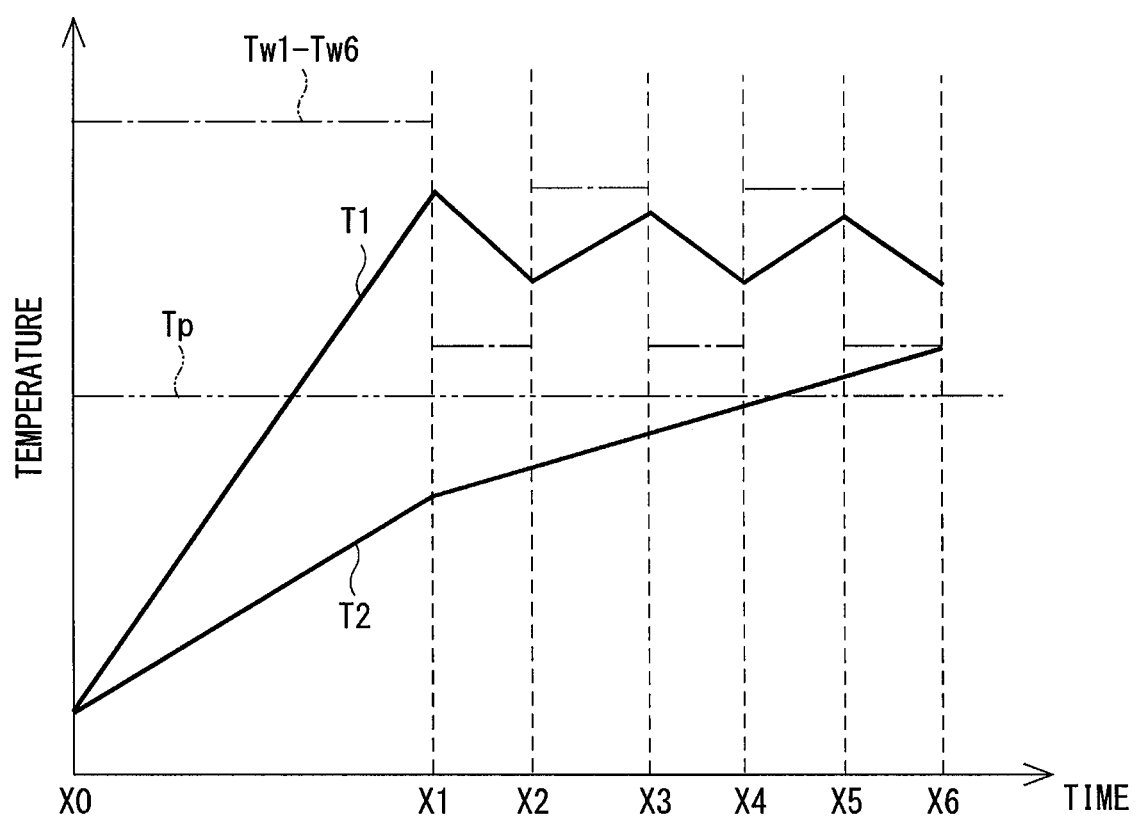
FIG. 3 is a time chart for explaining a process performed by a controller of the reflow device according to the first embodiment of the present disclosure.

As shown in FIG. 3, at the time x0, the controller 80 starts to control the first to sixth heating sections 11 to 16 and increases the first to sixth hot gas temperatures Tw1 to Tw6. The lower-heat-capacity temperature T1 and the higher-heat-capacity temperature T2 are increased. The change rate of the lower-heat-capacity temperature T1 is higher than the change rate of the higher-heat-capacity temperature T2.

After each of the lower-heat-capacity temperature T1 and the higher-heat-capacity temperature T2 is increased, at a time x1, the controller 80 reduces the first to sixth hot gas temperatures Tw1 to Tw6. Since the first heat capacity H1 is smaller on the substrate 90, the lower-heat-capacity temperature T1 is reduced. Since the second heat capacity H2 is larger on the substrate 90, the higher-heat-capacity temperature T2 is gradually increased. In this case, the controller 80 controls the first to sixth heating sections 11 to 16 such that the first to sixth hot gas temperatures Tw1 to Tw6 are equal to or more than the melting point Tp of the solder.

At a time x2, the controller 80 increases the first to sixth hot gas temperatures Tw1 to Tw6. The lower-heat-capacity temperature T1 and the higher-heat-capacity temperature T2 are increased. At a time x3, the controller 80 reduces the first to sixth hot gas temperatures Tw1 to Tw6. The lower-heat-capacity temperature T1 is reduced, while the higher-heat-capacity temperature T2 is gradually increased.

At a time x4, the controller 80 increases the first to sixth hot gas temperatures Tw1 to Tw6. Each of the lower-heat-capacity temperature T1 and the higher-heat-capacity temperature T2 is increased. At a time x5, the controller 80 reduces the first to sixth hot gas temperatures Tw1 to Tw6. The lower-heat-capacity temperature T1 is reduced, while the higher-heat-capacity temperature T2 is gradually increased. At a time x6, the first to sixth heating sections 11 to 16 are brought to a halt so that the substrate 90 is cooled.

Thus, the controller 80 performs, at least twice or more times, a process in which each of the lower-heat-capacity temperature T1 and the higher-heat-capacity temperature T2 is increased, and then the lower-heat-capacity temperature T1 is reduced, while the higher-heat-capacity temperature T2 is increased.

Referring to the flow chart of FIG. 4, a description will be given of a method for manufacturing the substrate 90 using the reflow device 1.

To perform the reflow soldering of the first component 91 and the second components 92 on the substrate 90, the reflow device 1 is used. The method for manufacturing the substrate 90 includes printing, component mounting, substrate transferring, pre-heating, first temperature controlling, second temperature controlling, repeating, and cooling.

Figure 4:
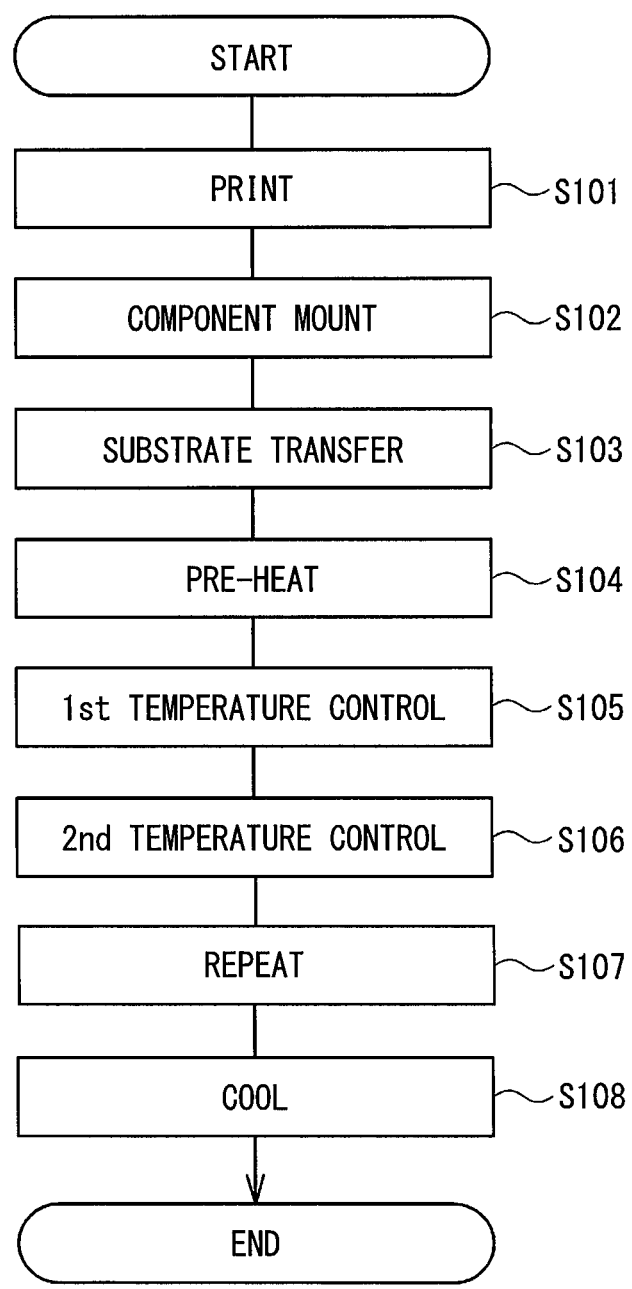
FIG. 4 is a flow chart for explaining a method for manufacturing a substrate using the reflow device according to the first embodiment of the present disclosure.

As shown in FIG. 4, in the printing of S101, onto the respective positions for the first component 91 and the second component 92 on the substrate 90, the solder paste 93 is printed using screen printing. Then, in the component mounting of S102, the components are mounted. In the substrate transferring of S103, the substrate 90 is transferred to a position opposed to the first to sixth heating sections 11 to 16. The substrate 90 is fixed stationery to the reflow device 1.

After the pre-heating of S104, in the first temperature controlling of S105, the controller 80 starts to control the first to sixth heating sections 11 to 16 and increases the first to sixth hot gas temperatures Tw1 to Tw6. Each of the lower-heat-capacity temperature T1 and the higher-heat-capacity temperature T2 is increased.

In the second temperature controlling of S106, the controller 80 controls the first to sixth heating sections 11 to 16 to increase each of the lower-heat-capacity temperature T1 and the higher-heat-capacity temperature T2, and then reduce the lower-heat-capacity temperature T1 while increase the higher-heat-capacity temperature T2. In this case, the controller 80 controls the first to sixth heating sections 11 to 16 such that the first to sixth hot gas temperatures Tw1 to Tw6 are equal to or more than the melting point Tp of the solder.

In the repeating of S107, the first temperature controlling and the second temperature controlling are repetitively performed in this order at least twice or more times. At this time, the solder paste 93 is melted so that the substrate 90 and each of the first component 91 and the second component 92 are connected via the solder paste 93.

In the cooling of S108, the substrate 90 is cooled so that the solder paste 93 is solidified. The substrate 90 and each of the first component 91 and the second components 92 are joined together via the solder paste 93.

On the substrate 90 used for an in-vehicle electronic control unit, not only the first component 91 having the smaller heat capacity, but also the second component 92 having the larger heat capacity may be mounted. In the future, a heat capacity difference ΔH of the components over the substrate may increase.

As a method for mounting the first component 91 and the second component 92 on the substrate 90, reflow soldering is used. When the heat capacity difference ΔH large over the substrate 90, the first component 91 is likely to be in an excessively heated state, while the second component 92 is likely to be in an unmelted state. Accordingly, even if the heat capacity difference ΔH over the substrate is large, it is required to uniformly heat the solder applied to the substrate 90. In addition, the second component 92 may elongate the time required to heat the solder. In view of this, when the solder applied to the substrate 90 is heated, the heating is preferably performed in a short period of time.

In a comparative technique in which a hot gas at a relatively high temperature is supplied to a component having a larger heat capacity, while a hot gas at a relatively low temperature is supplied to a component having a smaller heat capacity. In such a technique, however, the positions of the surface mounted components are limited on the substrate, and the reflow device may be complicated or increased in size.

The reflow device 1 in the present embodiment and the method for manufacturing the substrate 90 using the reflow device 1 equalize melting states of the solder over the substrate 90 in accordance with the heat capacities of the components and simplifies reflow soldering.

(Effects) (1) The controller 80 of the reflow device 1 performs, at least twice or more times, a process in which both of the lower-heat-capacity temperature T1 and the higher-heat-capacity temperature T2 are increased, and then the lower-heat-capacity temperature T1 is reduced, while the higher-heat-capacity temperature T2 is increased. This allows the lower-heat-capacity temperature T1 to be maintained at a constant level of equal to or more than the melting point Tp of the solder, while allowing the higher-heat-capacity temperature T2 to increase to the melting point Tp of the solder. As a result, a difference between the lower-heat-capacity temperature T1 and the higher-heat-capacity temperature T2 is likely to decrease so that the temperature over the substrate 90 is equalized. In addition, by reducing the time required to increase the higher-heat-capacity temperature T2, a heating time can be reduced. In addition, since it is sufficient to only set the control of the reflow device 1, the reflow device 1 has a simpler configuration.

(2) When the temperature of the solder paste 93 is repetitively increased and reduced, the solder paste 93 is repetitively melted and solidified so that the quality of the solder is likely to be unstable.

After both of the lower-heat-capacity temperature T1 and the higher-heat-capacity temperature T2 are increased, when the lower-heat-capacity temperature T1 is reduced, the controller 80 controls the first to sixth heating sections 11 to 16 such that the first to sixth hot gas temperatures Tw1 to Tw6 are equal to or more than the melting point Tp of the solder. Consequently, there is no solidification of the solder paste 93, and therefore the quality of the solder is stabilized.

(3) The first to sixth heating sections 11 to 16 may interfere with each other by blowing the gases to the adjacent heating sections to thus degrade the controllability of the first to sixth hot gas temperatures Tw1 to Tw6 by the controller 80.

The first to sixth heating sections 11 to 16 and the booth 30 are formed such that the second to sixth distances L2 to L6 are equal. Each of the first distance L1 and the seventh distance L7 is set to be half of each of the second to sixth distances L2 to L6. This allows the gases blown from the adjacent heating sections to be equally exhausted.

(4) Each of the first gas volume Qw1 and the sixth gas volume Qw6 is larger than each of the second to fifth gas volumes Qw2 to Qw5. This allows the gases blown from the first to sixth heating sections 11 to 16 to easily pass through the first to seventh exhaust flow paths 31 to 37 and suppresses the interference between the first to sixth heating sections 11 to 16 resulting from the blowing of the gases to the adjacent heating sections. As a result, the controllability of the first to sixth hot gas temperatures Tw1 to Tw6 by the controller 80 is improved.

(5) The cooler 60 supplies the cooled nitrogen to the first to sixth heating sections 11 to 16 such that the first to sixth hot gas temperatures Tw1 to Tw6 are equal to or less than the minimum temperature Tmin. This allows for easy equalization of the first to sixth hot gas temperatures Tw1 to Tw6, reduces the variations of the velocities of the hot gases blown from the first to six heating sections 11 to 16, and reduces the variations of the first to sixth gas volumes Qw1 to Qw6.

Second Embodiment

The second embodiment is the same as the first embodiment except that a refill pipe is additionally provided.

Figure 5:
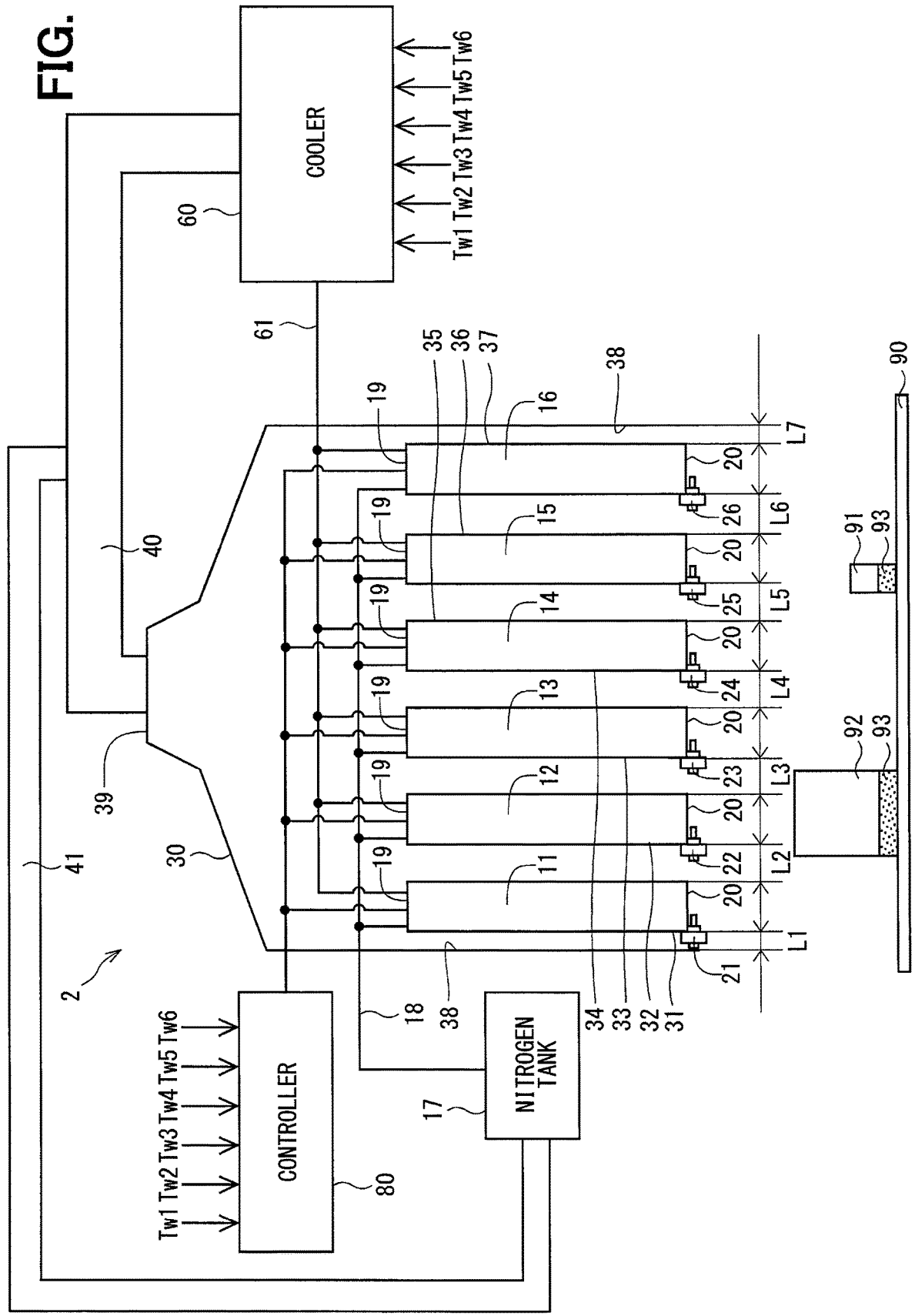
FIG. 5 is a diagram illustrating a configuration of a reflow device according to a second embodiment of the present disclosure.

As shown in FIG. 5, a reflow device 2 in the second embodiment further includes a refill pipe 41. The refill pipe 41 is connected to the booth pipe 40 and to the nitrogen tank 17 and capable of refilling the cooler 60 with nitrogen as a gas.

The second embodiment also achieves the same effects as achieved by the first embodiment.

When the cooler 60 retrieves the nitrogen exhausted from the exhaust opening 39 and cools the nitrogen, a loss in the pressure of the retrieved nitrogen increases. As a result, when the cooler 60 supplies the cooled nitrogen to the first to sixth heating sections 11 to 16, the power consumption of the reflow device 2 may be increased.

In the second embodiment, the cooler 60 is refilled with the nitrogen from the refill pipe 41 to cool the nitrogen exhausted from the exhaust opening 39. As a result, the power consumption of the reflow device 2 is reduced.

Third Embodiment

The third embodiment is the same as the first embodiment except that a bypass pipe and an auxiliary blower are additionally provided.

Figure 6:
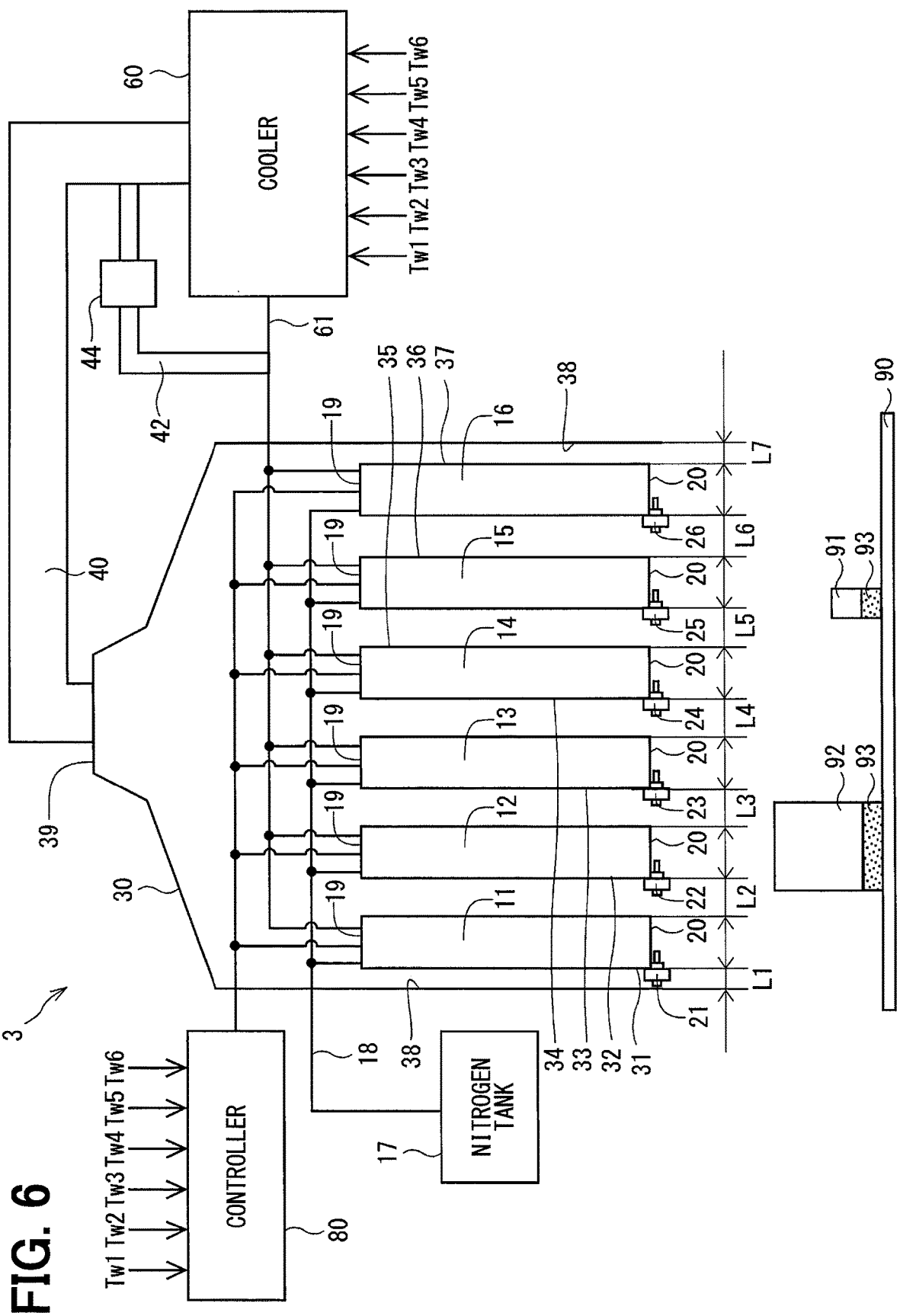
FIG. 6 is a diagram illustrating a configuration of a reflow device according to a third embodiment of the present disclosure.

As shown in FIG. 6, a reflow device 3 according to the third embodiment further includes a bypass pipe 42 and an auxiliary blower 44.

The bypass pipe 42 is connected to the booth pipe 40 and to the cooling pipe 61. The nitrogen exhausted from the exhaust opening 39 is supplied to the bypass pipe 42 and to the cooler 60 through the booth pipe 40. The nitrogen caused to flow through the bypass pipe 42 is supplied to the first to sixth heating sections 11 to 16 through the cooling pipe 61.

The auxiliary blower 44 is provided in the bypass pipe 42. The auxiliary blower 44 assists in supplying the nitrogen caused to flow through the bypass pipe 42 to the first to sixth heating sections 11 to 16.

The third embodiment also achieves the same effects as achieved by the first embodiment. Additionally, in the third embodiment, nitrogen is cooled while flowing through the bypass pipe 42, and the cooled nitrogen is supplied to the first to sixth heating sections 11 to 16. This allows a reduction in the cooling ability of the cooler 60 and a reduction in the power consumption of the cooler 60.

Fourth Embodiment

The fourth embodiment is the same as the first embodiment except that a circulation pipe is additionally provided.

Figure 7:
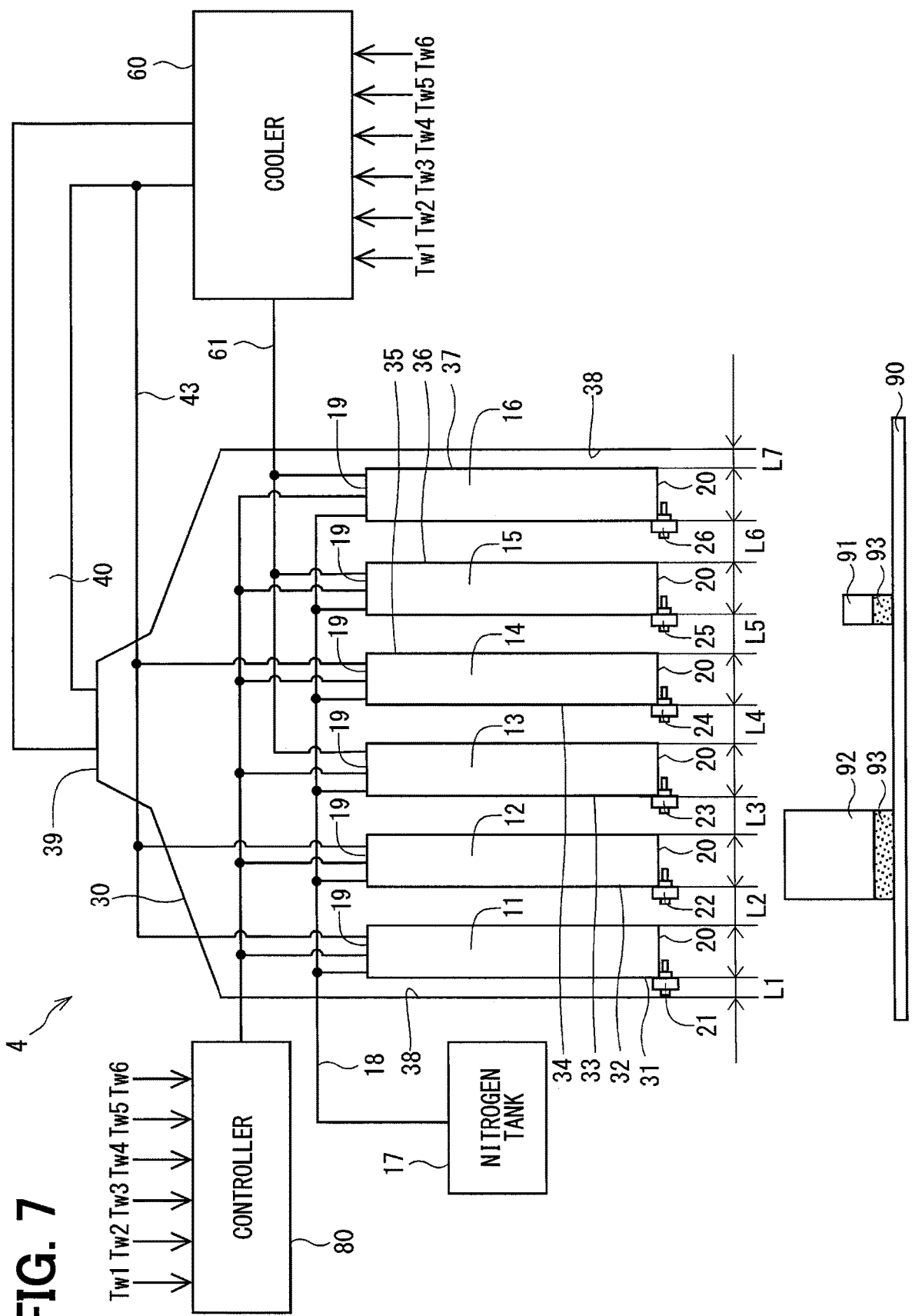
FIG. 7 is a diagram illustrating a configuration of a reflow device according to a fourth embodiment of the present disclosure.

As shown in FIG. 7, a reflow device 4 in the fourth embodiment further includes a circulation pipe 43. The cooling pipe 61 of the reflow device 4 is connected to the third heating section 13, to the fifth heating section 15, to the sixth heating section 16, and to the cooler 60.

The circulation pipe 43 is connected to the booth pipe 40, to the first heating section 11, to the second heating section 12, and to the fourth heating section 14. The nitrogen exhausted from the exhaust opening 39 is supplied to the circulation pipe 43 and to the cooler 60 through the booth pipe 40. The nitrogen caused to flow through the circulation pipe 43 is supplied to the first heating section 11, to the second heating section 12, and to the fourth heating section 14.

The fourth embodiment also achieves the same effects as achieved by the first embodiment. Additionally, in the fourth embodiment also, in the same manner as in the third embodiment, the power consumption of the cooler 60 can be reduced.

Fifth Embodiment

The fifth embodiment is the same as the first embodiment except that the substrate is not fixed but is moved.

Figure 8:
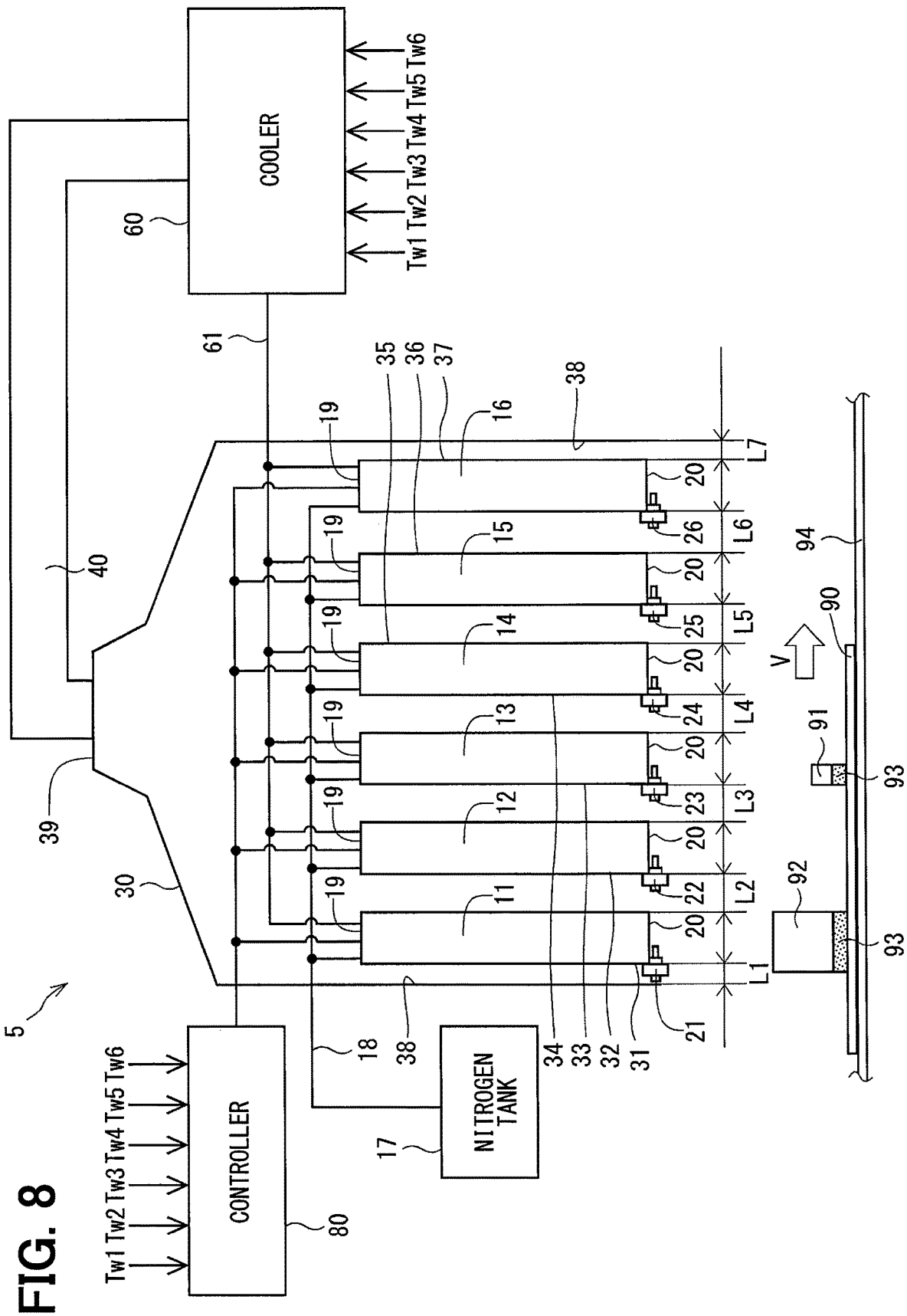
FIG. 8 is a diagram illustrating a configuration of a reflow device according to a fifth embodiment of the present disclosure.

As shown in FIG. 8, the substrate 90 is moved by a transfer belt 94 from the first heating section 11 toward the sixth heating section 16. A reflow device 5 in the fifth embodiment is a so-called continuous furnace. The substrate 90 is moved relatively to the reflow device 5 at a predetermined velocity V.

Referring to the time chart of FIG. 9, a description will be given of the control by the controller 80 of the reflow device 5.

It is assumed that Y0 denotes the time when the controller 80 starts to control the first to sixth heating sections 11 to 16. In FIG. 9, the lower-heat-capacity temperature T1 and the higher-heat-capacity temperature T2 are shown by the solid lines.

The first to sixth hot gas temperatures Tw1 to Tw6 are shown by the dot-dash lines. The melting point Tp of the solder is shown by the two-dot-dash line.

Figure 9:
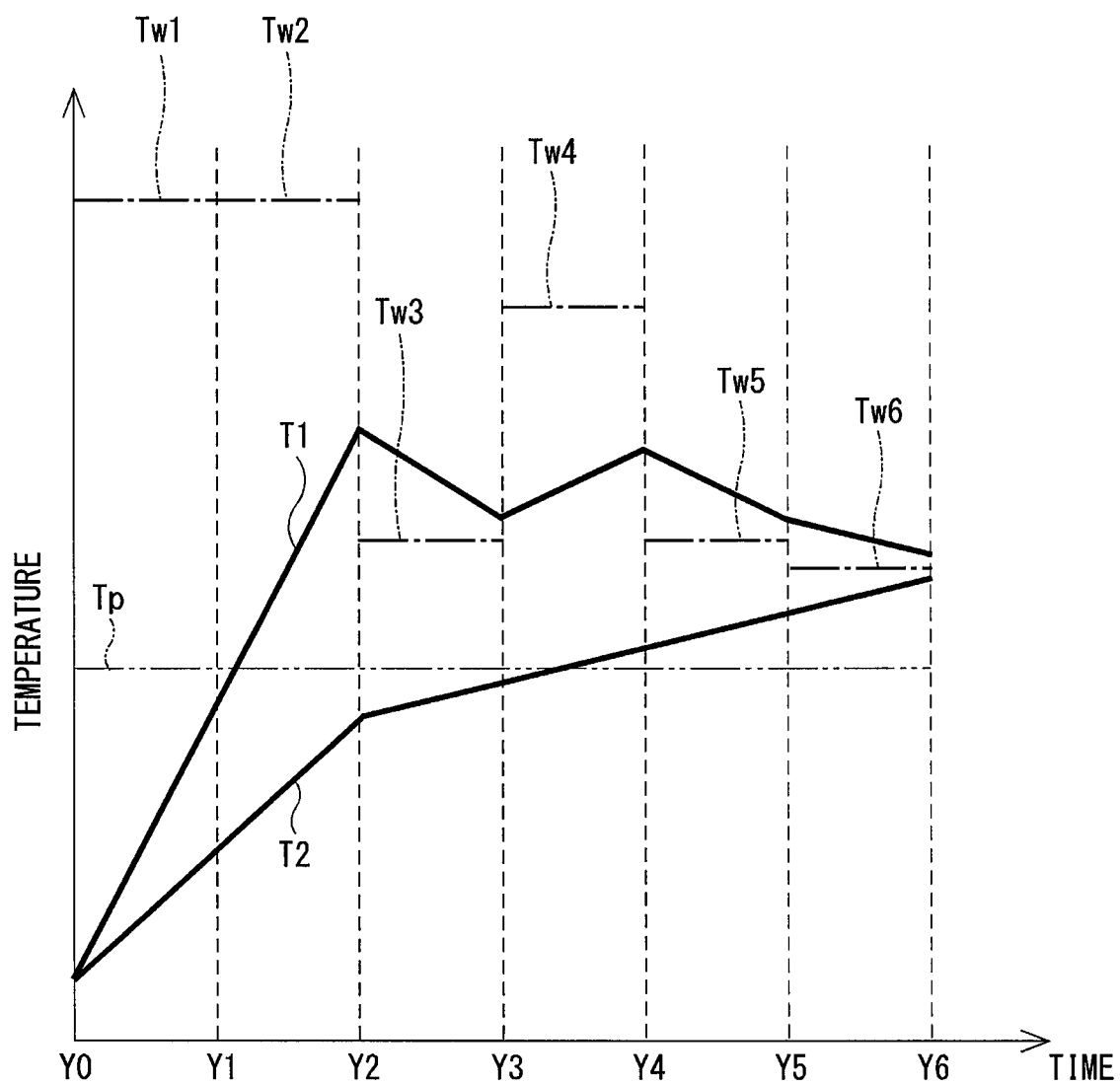
FIG. 9 is a time chart for explaining a process performed by a controller of the reflow device according to the fifth embodiment of the present disclosure.

As shown in FIG. 9, at the time Y0, the substrate 90 passes through a position opposed to the first heating section 11, and the controller 80 is controlling the first heating section 11. The first hot gas temperature Tw1 is set relatively high. The lower-heat-capacity temperature T1 and the higher-heat-capacity temperature T2 are increased.

At a time Y1, the substrate 90 passes through a position opposed to the second heating section 12, and the controller 80 is controlling the second heating section 12. The controller 80 controls the first to sixth heating sections 11 to 16 such that the first to sixth hot gas temperatures Tw1 to Tw6 are equal to or more than the melting point Tp of the solder. The second hot gas temperature Tw2 is set equal to the first hot gas temperature Tw1. The lower-heat-capacity temperature T1 and the higher-heat-capacity temperature T2 are increased.

At a time Y2, the substrate 90 passes through a position opposed to the third heating section 13, and the controller 80 is controlling the third heating section 13. The third hot gas temperature Tw3 is set lower than each of the first hot gas temperature Tw1 and the second hot gas temperature Tw2. Over the substrate 90, the first heat capacity H1 is smaller so that the lower-heat-capacity temperature T1 is reduced. Over the substrate 90, the second heat capacity H2 is larger so that the higher-heat-capacity temperature T2 is gradually increased.

At a time Y3, the substrate 90 passes through a position opposed to the fourth heating section 14, and the controller 80 is controlling the fourth heating section 14. The fourth hot gas temperature Tw4 is set higher than the third hot gas temperature Tw3 and lower than each of the first hot gas temperature Tw1 and the second hot gas temperature Tw2. The lower-heat-capacity temperature T1 and the higher-heat-capacity temperature T2 are increased.

At a time Y4, the substrate 90 passes through a position opposed to the fifth heating section 15, and the controller 80 is controlling the fifth heating section 15. The fifth hot gas temperature Tw5 is set lower than the fourth hot gas temperature Tw4. The lower-heat-capacity temperature T1 is reduced, while the higher-heat-capacity temperature T2 is gradually increased. At the time Y4, the higher-heat-capacity temperature T2 becomes equal to or more than the melting point Tp of the solder.

At a time Y5, the substrate 90 passes through a position opposed to the sixth heating section 16, and the controller 80 is controlling the sixth heating section 16. The sixth hot gas temperature Tw6 is set lower than the fifth hot gas temperature Tw5. The lower-heat-capacity temperature T1 and the higher-heat-capacity temperature T2 are increased.

At a time Y6, the passing of the first to sixth heating sections 11 to 16 through the substrate 90 is completed so that the substrate 90 is cooled. Note that the time intervals between adjacent twos of the times Y0 to Y6 are equal and calculated using the movement distance of the substrate 90 and the velocity V.

In a method for manufacturing the substrate 90 using the reflow device 5 of the fifth embodiment, the substrate transferring of S103 is different from that in the method for manufacturing the substrate 90 using the reflow device 1 of the first embodiment.

In the substrate transferring of S103, the substrate 90 is moved at the velocity V so as to be opposed to the reflow device 5. In S105 to S107, the controller 80 controls the first to sixth hot gas temperatures Tw1 to Tw6, while the substrate 90 is moved.

Even when the substrate 90 is thus moved, the same effects as achieved by the first embodiment are achieved.

Other Embodiments (i) Each of the heating sections of the reflow device is not limited to a heating section using a hot gas. The heating section may also heat the substrate using an infrared ray as a type of an electromagnetic wave. The heating using the infrared ray increases an energy efficiency and reduces a heating time.

(ii) The number of the plurality of heating sections is not limited to 6. At least two or more heating sections may be provided appropriately.

Figure 10:
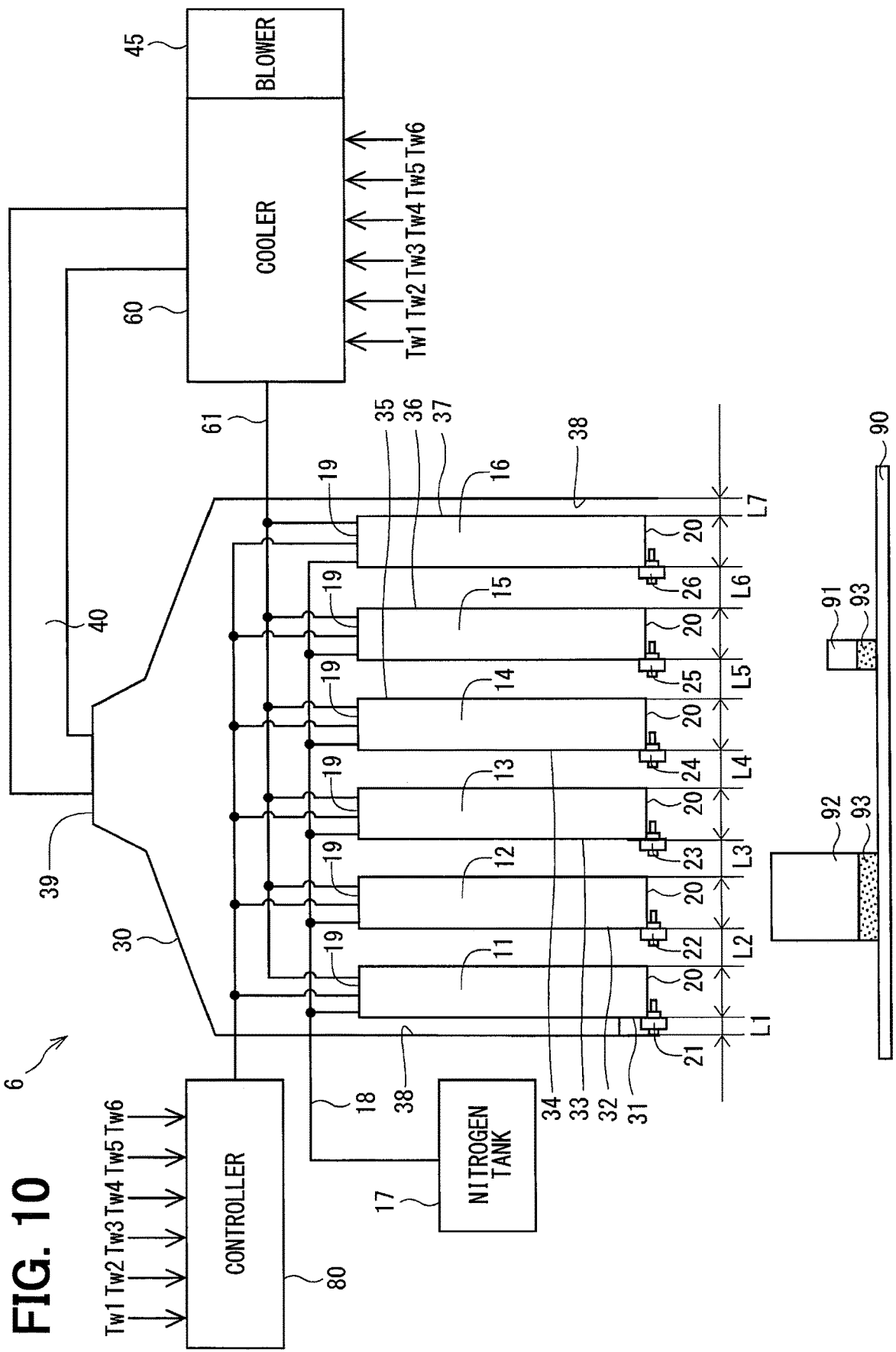
FIG. 10 is a diagram illustrating a configuration of a reflow device according to another embodiment.

(iii) As shown in FIG. 10, the cooler 60 in the reflow device 6 may also be provided with a blower 45.

Figure 11:
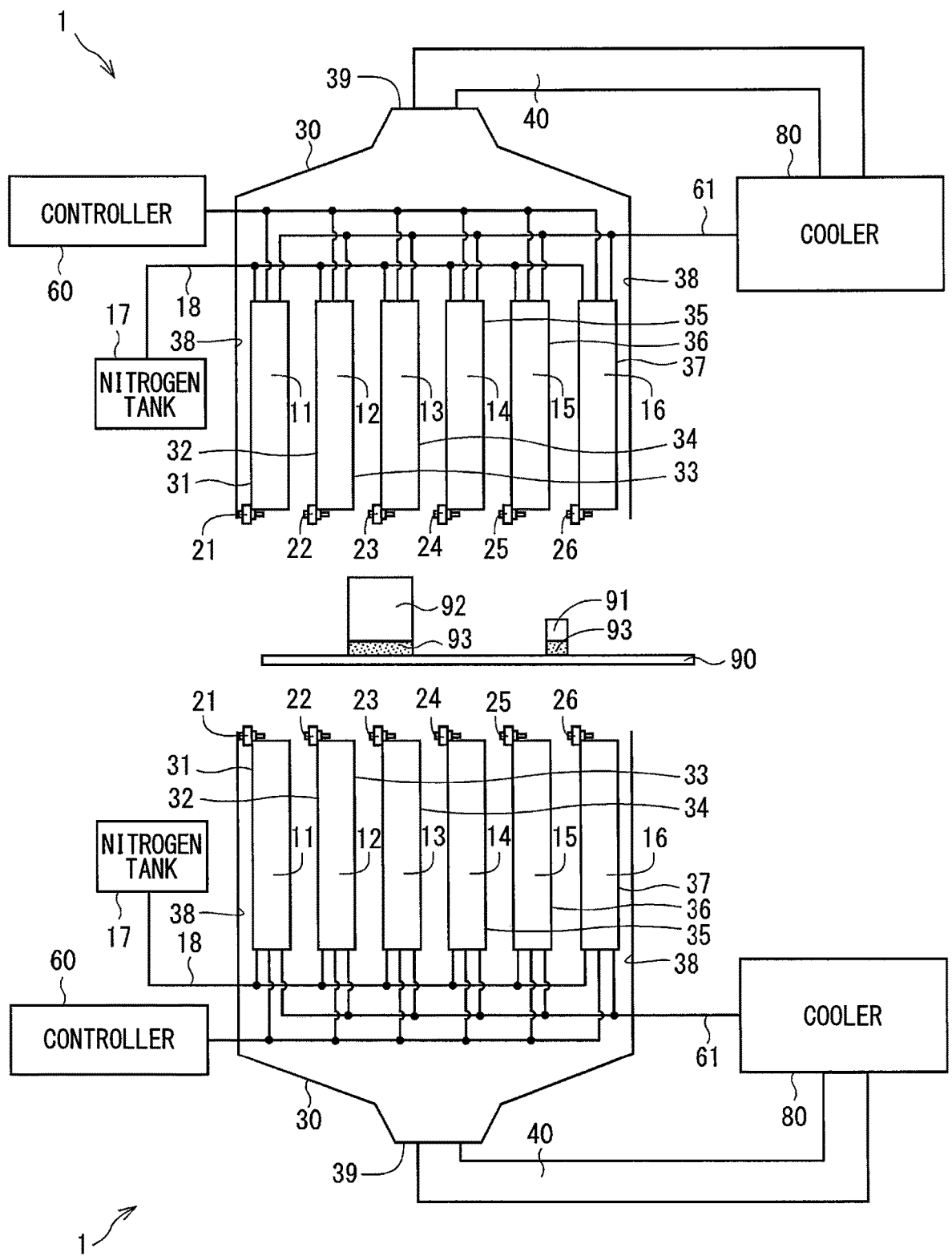
FIG. 11 is a diagram illustrating a configuration of a reflow device according to still another embodiment.

(iv) As shown in FIG. 11, a plurality of the reflow devices 1 may also be provided such that the single substrate 90 is interposed therebetween.

(v) In the reflow device 4 in the fourth embodiment also, the furnace is not limited to the batch furnace and may also be a continuous furnace. In the reflow device 4, when the continuous furnace is provided, the effect of further reducing the power consumption of the cooler 60 is achieved.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A reflow device configured to perform reflow soldering on a substrate having a first component and a second component, the second component having a heat capacity larger than a heat capacity of the first component, the reflow device comprising:

a plurality of heating sections each configured to apply gas to the substrate to increase a temperature of the first component and a temperature of the second component;

a booth that accommodates the plurality of heating sections therein, has an exhaust flow path and an exhaust opening, the exhaust flow path being defined between an inner wall of the booth and the heating sections and between adjacent heating sections, the exhaust flow path communicating with the exhaust opening, the exhaust flow path and the exhaust opening allowing the gas applied from each of the heating sections to exhaust; and a controller that is configured to perform, at least twice or more times, a heating control of controlling the heating sections to increase both of the temperature of the first component and the temperature of the second component, and then reduce the temperature of the first component while increasing the temperature of the second component.

2. The reflow device according to claim 1, wherein the controller is configured to control each of the heating sections such that a temperature of the gas applied from the heating section is equal to or more than a melting point of a solder, when the temperature of the first component is reduced after both of the temperature of the first component and the temperature of the second component are increased.

3. The reflow device according to claim 1, wherein the plurality of heating sections are arranged such that a distance between the inner wall of the booth and the heating section opposed to the inner wall is half a distance between the adjacent heating sections.

4. The reflow device according to claim 1, wherein among the plurality of heating sections, a volume of the gas applied by end heating sections that are arranged to oppose the inner wall of the booth, is greater than a volume of the gas applied by intermediate heating sections that are arranged between the end heating sections.

5. The reflow device according to claim 1, further comprising:

a cooler connected to the booth to retrieve and cool the gas that has carried through the exhaust flow path and the exhaust opening, wherein the cooler is configured such that a temperature of the gas applied from each of the heating sections is controlled to a level of equal to or less than a lowest one of temperatures of the gases applied from the heating sections.

6. The reflow device according to claim 5, further comprising:

a booth pipe connecting the exhaust opening and the cooler; and a refill pipe connected to the booth pipe to refill the cooler with the gas.

7. The reflow device according to claim 5, further comprising:

a booth pipe connecting the exhaust opening and the cooler;

a cooling pipe connecting the heating sections and the cooler; and a bypass pipe connecting the booth pipe and the cooling pipe.

8. The reflow device according to claim 5, further comprising:

a booth pipe connecting an opening of the booth and the cooler; and a circulation pipe connecting the booth pipe and at least one of the heating sections.

9. A method for manufacturing a substrate by reflow soldering using a reflow device, the reflow device including:

a plurality of heating sections each configured to apply gas to a substrate to increase a temperature of a first component on the substrate and a temperature of a second component on the substrate, the second component having a heat capacity larger than a heat capacity of the first component;

a booth that accommodates the plurality of heating sections therein, has an exhaust flow path and an exhaust opening, the exhaust flow path being defined between an inner wall of the booth and the heating sections and between adjacent heating sections, the exhaust flow path communicating with the exhaust opening, the exhaust flow path and the exhaust opening allowing the gas applied from each of the heating sections to exhaust; and a controller that is configured to control the plurality of heating sections, the method comprising:

performing a first temperature control to increase both of the temperature of the first component and the temperature of the second component;

after the performing of the first temperature control, performing a second temperature control to reduce the temperature of the first component and increase the temperature of the second component; and repeating the performing of the first temperature control and the performing of the second temperature control, at least twice or more times, in this order.

10. The method for manufacturing the substrate according to claim 9, wherein the performing of the second temperature control includes controlling a temperature of the gas applied from each of the heating sections to be equal to or more than a melting point of a solder, when the temperature of the first component is reduced.

* * * * *